US009934340B2

(12) United States Patent
Naito et al.

(10) Patent No.: US 9,934,340 B2
(45) Date of Patent: Apr. 3, 2018

(54) CONTACT SIMULATION METHOD FOR RUBBER MATERIAL

(71) Applicants: SUMITOMO RUBBER INDUSTRIES, LTD., Kobe-shi, Hyogo (JP); Yuzuru Sakai, Yokohama-shi, Kanagawa (JP)

(72) Inventors: Masato Naito, Kobe (JP); Yuzuru Sakai, Yokohama (JP)

(73) Assignees: SUMITOMO RUBBER INDUSTRIES, LTD., Kobe-Shi, Hyogo (JP); YUZURU SAKAI, Yokohama-Shi, Kanagawa (JP)

( * ) Notice: Subject to any disclaimer, the term of this patent is extended or adjusted under 35 U.S.C. 154(b) by 1020 days.

(21) Appl. No.: 14/223,732

(22) Filed: Mar. 24, 2014

(65) Prior Publication Data
US 2014/0297236 A1    Oct. 2, 2014

(30) Foreign Application Priority Data

Apr. 1, 2013  (JP) ................................. 2013-076230

(51) Int. Cl.
G06F 17/50    (2006.01)

(52) U.S. Cl.
CPC ...... G06F 17/5018 (2013.01); G06F 17/5009 (2013.01)

(58) Field of Classification Search
CPC .......................... G06F 17/5018; G06F 17/5009
USPC .......................................................... 703/1, 2
See application file for complete search history.

(56) References Cited

U.S. PATENT DOCUMENTS

2012/0232848 A1*  9/2012 Naito .................. G06F 17/5095
703/1

OTHER PUBLICATIONS

Drozdov., "Constitutive equations in finite elasticity of rubbers". International Journal of Solids and Structures 44 (2007). p. 272-297.*
Arruda E M et al: "A three-dimensional constitutive model for the large stretch behavior of rubber elastic materials", Journal of the Mechanics and Physics of Solids, Pergamon Press, Oxford, GB, vol. 41, No. 2, Feb. 1, 1993, XP024446691, pp. 389-412.
F. Bohm et al: "On the Roots of Tire Mechanics", Vehicle System Dynamics, vol. 27, No. sup001, Jan. 1, 1997, XP055136153, pp. 303-317.
Pawea Baranowski et al: "Blast Wave and Suspension System Interaction—Numerical Approach", Journal of KONES Powertrain and Transport, Jan. 1, 2011, XP055136561, pp. 17-24.

(Continued)

Primary Examiner — Eunhee Kim
(74) Attorney, Agent, or Firm — Birch, Stewart, Kolasch & Birch, LLP

(57) ABSTRACT

A computer-implemented method for simulating a contact state of a rubber material with a contact surface is disclosed, wherein a rubber model of the rubber material is defined; the rubber material is modeled by a finite number of particles on which a motion equation is defined; a contact zone model of a contact zone including the contact surface is defined; the contact zone is modeled by a finite number of particles; the rubber model is contacted with the contact zone model and a deformation calculation of the rubber model is performed; and the motion equations defined on the particles of the rubber material have a term expressive of resilience of the rubber material.

4 Claims, 12 Drawing Sheets
(3 of 12 Drawing Sheet(s) Filed in Color)

(56) References Cited

OTHER PUBLICATIONS

Pinnington Roger J Ed; "Tyre-road contact using a particle-envelope surface model" Journal of Sound & Vibration, vol. 332, No. 26, Jan. 1, 2007, XP028733250, pp. 7055-7075.
Yoichi Kawashima, et al., "Large Deformation Analysis of Hyperelastic Materials Using SPH Method", e-Journal of Soft Materals, The Society of Rubber Industry, 2007, pp. 21-28, vol. 3.
Yuzuru Sakai, "Fundamentals and Applications of SPH Method", CAE Social Gathering, Oct. 21, 2012, 10 pages.

\* cited by examiner

CONTACT SIMULATION METHOD FOR RUBBER MATERIAL

BACKGROUND OF THE INVENTION

The present invention relates to a contact simulation method for a rubber material capable of simulating a contact state of a rubber material with a surface of an arbitrary material.

In order to analyze a contact state of a rubber material with a surface of an arbitrary material, there has been proposed a simulation method in which, according to a finite element method, the rubber material and a contact zone of the material including the contact surface are respectively modeled by a finite number of elements on which material characteristics are defined, and the contact state is simulated by the use of such rubber model and contact zone model.

In this method, since the adjacent elements are linked to each other, if the tensile deformation of the rubber model during the deformation calculation becomes very large for example exceeds 100%, there is a possibility that the elements are broken and a calculation failure is caused.

Therefore, in the simulation method based on the finite element method, there is a problem such that it is difficult to fully or accurately analyze the contact state of a rubber material subjected to a large deformation.

In the following non-patent document 1, there has been proposed a simulation method based on molecular dynamics in which interactions between molecular models are defined and intermolecular contact is analyzed. The above-mentioned calculation failure does not occur in this method.

In this method based on molecular dynamics, contacts at the micro-level or nano-level occurring between molecules can be analyzed, but it is realistically impossible to use this method to analyze contacts at the macro-level occurring between a rubber material and a surface of another object.

In the following non-patent document 2 or non-patent document 3, there has been proposed a simulation method based on the particle method in which an analysis object is modeled by a finite number of particles on which Newton's motion equations are respectively defined instead of the above-explained interactions therebetween.

In these methods, however, the resilience of the rubber material is not defined in the motion equation, therefore, if the deformation of the rubber model is increased during deformation calculation, the rubber model can not return to its former shape.

Thus, in the methods based on such particle method, there is a problem such that the contact state of the rubber material subjected to a relatively large deformation can not be analyzed.

[Non-Patent Document 1]
H. Morita, T. Ikehara, T. Nishi, M. Doi, Polymer J. 36, 265 (2004) polymer journal 36, 265 2004
[Non-Patent Document 2]
Yoichi KAWASHIMA and Yuzuru SAKAI "Large Deformation Analysis of Hyperelastic Materials using SPH Method" e-Journal of Soft Materials Vol. 3, pp. 22-28 (2007)
[Non-Patent Document 3]
Yuzuru SAKAI, "Fundamentals and Applications of SPH method", [online], CAE social gathering, [searched on Oct. 1, 2012], <Internet URL: http://www.cae21.org/kaisekijuku2006/SPH.pdf>

SUMMARY OF THE INVENTION

It is therefore, an object of the present invention to provide a contact simulation method for a rubber material in which a contact state of a rubber material with a surface of another object can be simulated with high accuracy even if the rubber material model is subjected to a large deformation.

According to the present invention, a computer-implemented contact simulation method for simulating a contact state of a rubber material with a contact surface of another object, comprises a rubber model defining process in which a rubber model of the rubber material is defined in the computer, wherein the rubber material is modeled by a finite number of particles on which a motion equation is defined, a contact zone model defining process in which a contact zone model of a contact zone including the contact surface is defined in the computer, wherein the contact zone is modeled by a finite number of particles, and a deformation calculation process in which the rubber model is contacted with the contact zone model, and a deformation calculation of the rubber model is performed by the computer, wherein the motion equations defined on the particles of the rubber material have a term expressive of resilience of the rubber material against its tensile deformation.

In this application, the term "rubber material" means a rubbery elastic body.

Therefore, in the contact simulation method according to the present invention, since the rubber material is modeled by a finite number of particles, calculation failures due to breaking of elements in the FEM are eliminated. Accordingly, even if the rubber material model is subjected to a large deformation for example a tensile deformation of more than 100% during the deformation calculation, it is possible to normally carry on the deformation calculation.

Further, the motion equation of the rubber model includes a term expressive of resilience of the rubber material against its tensile deformation. Accordingly, even if the rubber model is largely deformed during simulation, the rubber model can restore its previous shape. Thus, the method according to the present invention can accurately simulate the contact state of the rubber material with the contact surface of another object, and thereby accurate analysis is possible.

BRIEF DESCRIPTION OF THE DRAWINGS

The patent or application file contains at least one color drawing. Copies of this patent or patent application publication with color drawings will be provided by the USPTO upon request and payment of the necessary fee.

DESCRIPTION OF THE PREFERRED EMBODIMENTS

Embodiments of the present invention will now be described in detail in conjunction with accompanying drawings.

According to the present invention, a contact simulation method is implemented by a computer 3 to analyze a contact state of a rubber material 1 with a contact surface 2S.

Figure 2:
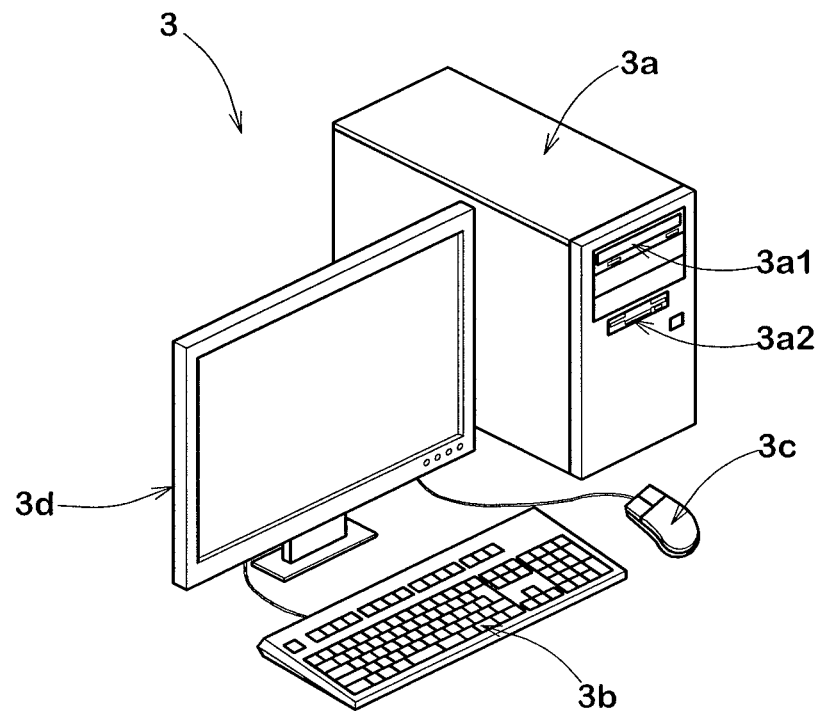
FIG. 2 is a perspective view of a computer system used in the contact simulation method.

As shown in FIG. 2, the computer 3 comprises a main body 3a, a keyboard 3b, a mouse 3c and a display 3d. The main body 3a comprises an arithmetic processing unit (CPU), memory, storage devices such as magnetic disk, disk drives 3a1 and 3a2 and the like. In the storage device, programs/software for carrying out the contact simulation method are stored.

Figure 3:
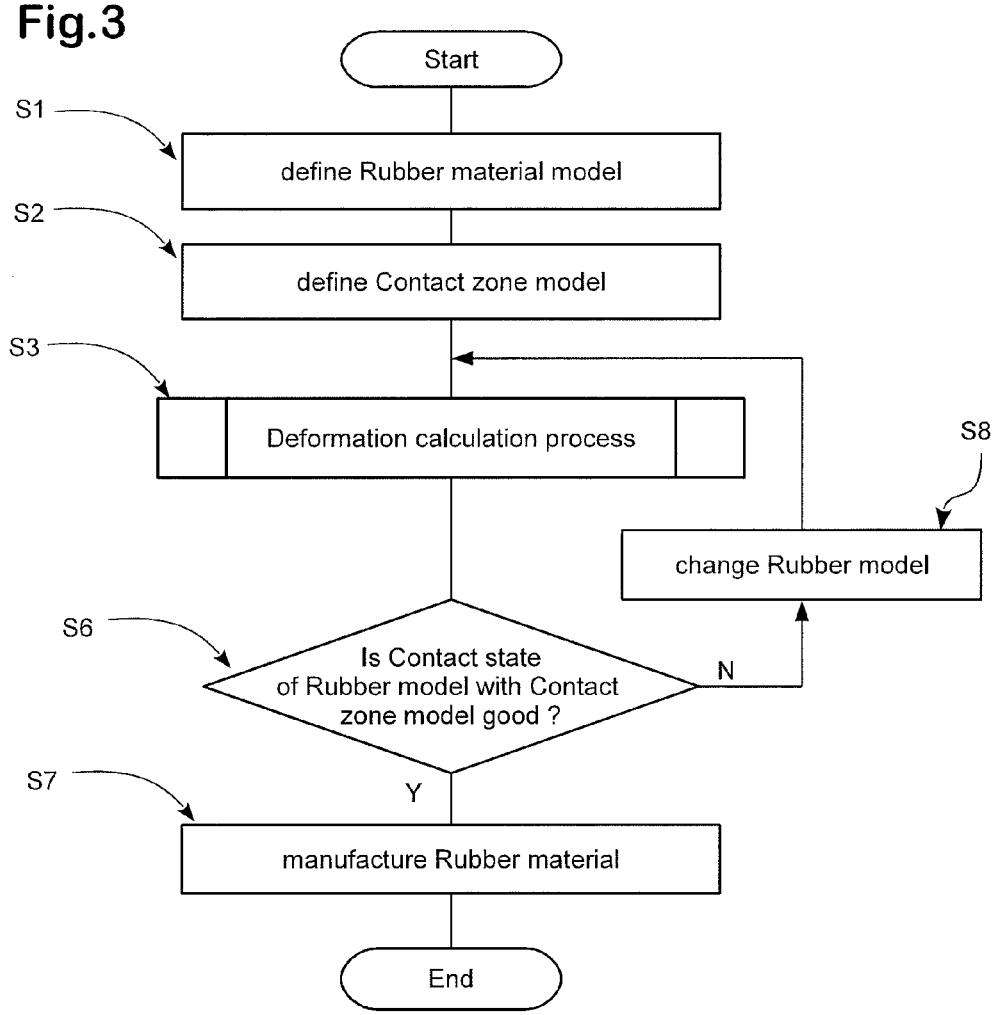
FIG. 3 is a flow chart of the contact simulation method as an embodiment of the present invention.

FIG. 3 shows a flowchart of the contact simulation method of this embodiment.

Rubber Model Defining Process S1

Figure 1:
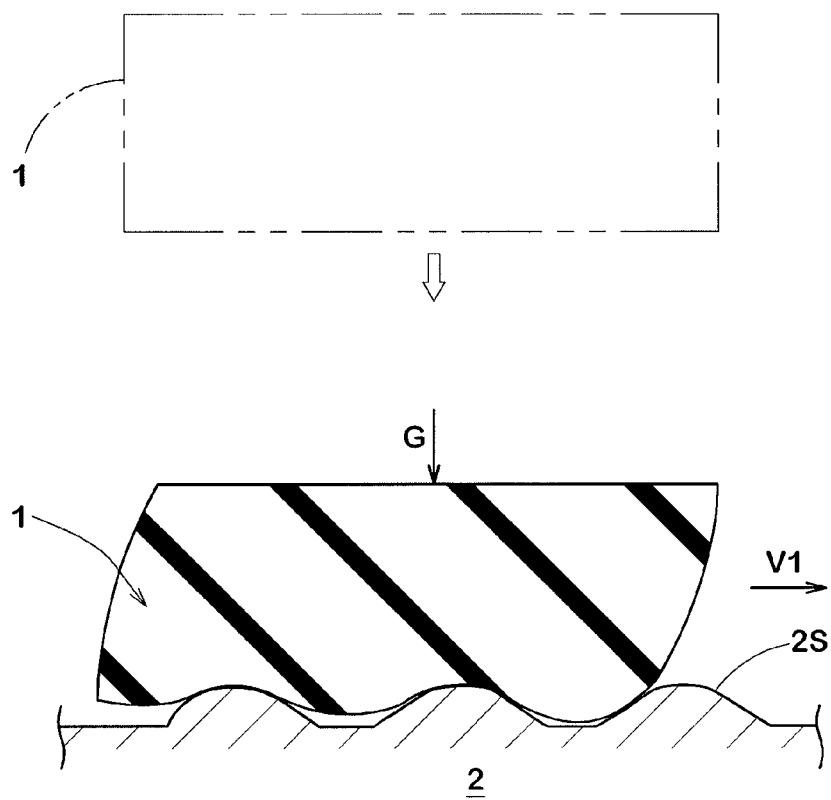
FIG. 1 is a cross sectional view showing a rubber material and a contact zone used in a contact simulation method according to the present invention.

In this process S1, a rubber model 5 of the rubber material 1 (as shown in FIG. 1) is defined in the computer 3 according to a particle method.

Figure 4:
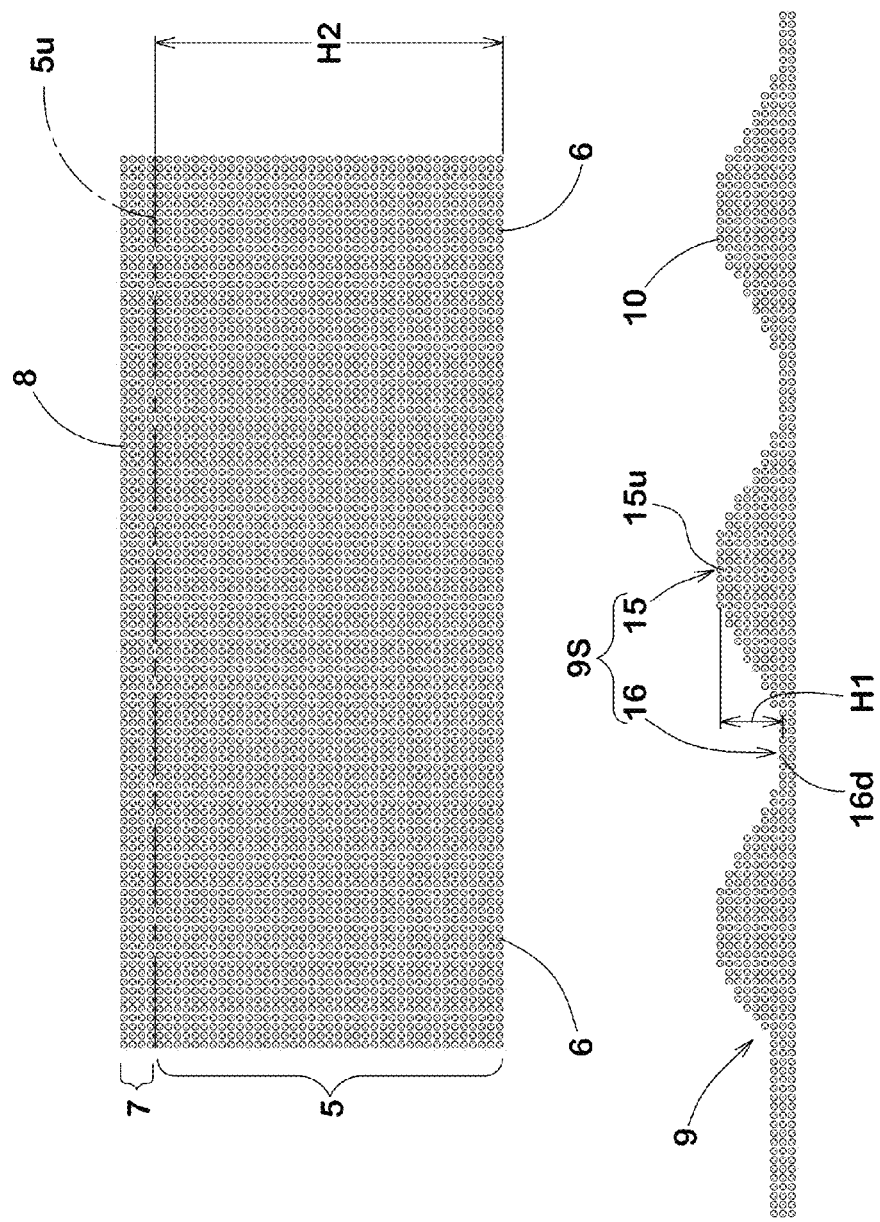
FIG. 4 shows a rubber model and a contact zone model.

For example, as shown in FIG. 4, a two-dimensional rubber model 5 is defined, namely, the two-dimensional cross-sectional shape (rectangular shape) of the rubber material 1 is modeled by a finite number of particles 6.

Incidentally, each particle 6 corresponds to numerical data about the mass, volume, diameter, coordinates, material characteristics and the like which are stored in the computer 3.

As to the particle method, the SPH method as disclosed in the above-mentioned non-patent document 2 or non-patent document 3 is used in this embodiment.

Figure 5:
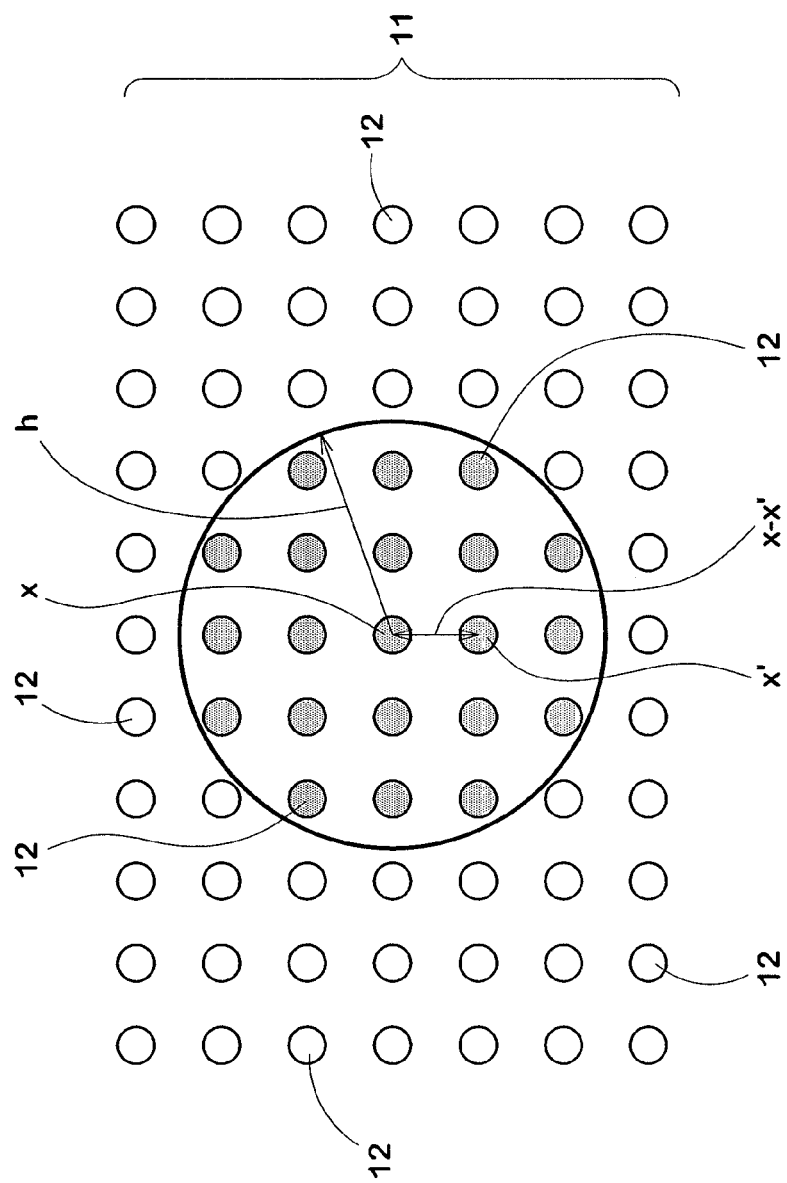
FIG. 5 shows a continuum discretized into particles.

The SPH method is a technique to discretize an arbitrary continuum 11 by a plurality of particles 12 as shown in FIG. 5, and to treat the aggregation of the particles 12 as the continuum 11.

Physical quantity f(x) of each particle 12 is defined by the following expression (1) according to the non-patent document 2 or non-patent document 3.

$$f(x) \approx \int f(x') W(x-x', h) dx' \quad \text{expression (1)}$$

wherein
W(x–x', h) is a weighting function,
x is the coordinate value of the center of an evaluating particle,
x' is the coordinate value of the center of another particle, and
h is the influence radius.

The weighting function W(x–x', h) is for weighting the particles 12 existing within the range of the influence radius h. In order that the physical quantity f(x) can be obtained by computing the expression (1), it is need to satisfy the following conditional expressions (2)-(4).

$$\lim_{h \to 0} W(x-x', h) = \delta(x-x') \quad \text{expression (2)}$$

$$\int W(x, h) dx = 1 \quad \text{expression (3)}$$

$$W(x, h) = 0 \quad \text{for } |x| \geq 2h \quad \text{expression (4)}$$

The expression (2) defines the limit (h-->0) of the weighting function (x–x', h) as being a delta function.

The expression (3) means that the weighting function W(x–x', h) is normalized.

The expression (4) defines the weighting function W(x–x', h) as being zero for the particles 12 outside the range of the influence radius h, namely, it means that compactification is made.

Incidentally, the expression (1) may be transformed as appropriate according to the non-patent document 2 or non-patent document 3.

In the SPH method, the motion equation as defined by the following expression (5) is defined on each particle 12.

The expression (5) defines the acceleration (a) of the particle 12 which defines the motion of the particle 12.

Incidentally, the expression (5) may be transformed as appropriate according to the non-patent document 2 or non-patent document 3.

$$a = \frac{1}{\rho} \nabla \cdot \sigma \quad \text{expression (5)}$$

wherein
a is the acceleration of the particle concerned,
ρ is the density of the particle, and
σ is the stress tensor.

In the SPH method, the strain $\epsilon_{ij}$ in the two-dimensional elastic field, namely, the continuum 11 can be obtained by the use of the following expression (6) relating to the strain velocity and particle velocity.

$$\varepsilon_{ij} = \frac{1}{2}\left(\frac{\partial V_i}{\partial x_j} + \frac{\partial V_j}{\partial x_i}\right) \quad \text{expression (6)}$$

wherein
$V_i$ is the velocity of an evaluating particle,
$x_i$ is the coordinate of the evaluating particle,
$V_j$ is the velocity of another particle within the influence radius,
$x_j$ is the coordinate of the another particle.

In this embodiment, the physical quantity f(x) given by the expression (1) is defined on the rubber model 5.

In this embodiment, for the weighting function W(x–x', h), a cubic spline function is used.

Figure 9:
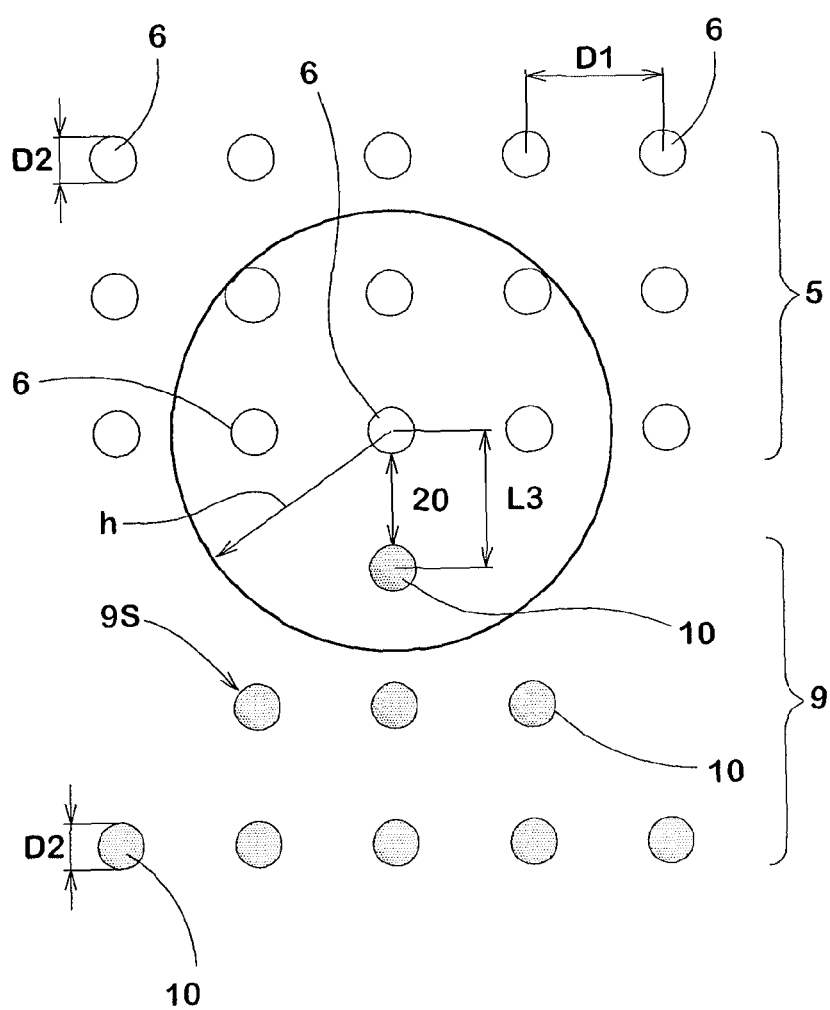
FIG. 9 shows particles of the rubber model and particles of the contact zone model for explaining contact spring defined therebetween.

In this embodiment, in the initial state before the deformation calculation is performed, a value of two times the distance D1 between the adjacent particles 6 and 6 (as shown in FIG. 9) is set to the influence radius h.

In this embodiment, on each particle 6 of the rubber model 5, a motion equation given by the following expressions (7) and (8) is defined.

$$a + f = \frac{1}{\rho} \nabla \cdot \sigma \qquad \text{expression (7)}$$

$$f = \frac{1}{\rho} \sum_{i}^{n} \left( k \frac{\Delta C_i}{\Delta L_i} W_i + \eta \frac{\Delta C_i}{\Delta t} W_i \right) \qquad \text{expression (8)}$$

wherein
f is the viscoelastic force between particles,
k is the spring coefficient,
η is the shear spring modulus,
$\Delta L_i$ is the length of the spring,
$\Delta C_i$ is the amount of stretching,
$\Delta t$ is a time increment, and
$w_i$ is the weighting factor.

In the expression (7), on the basis of the above-mentioned expression (5), the viscoelastic force f between the concerned particles 6 is added.

The viscoelastic force f is a function, and can suppress an expansion between the particles 6 and 6 (such as tensile deformation) caused by the acceleration (a). Thereby, the motion equation defined on the rubber model 5 is provided with resilience against tensile deformation of the rubber material 1. As a result, even if the rubber model 5 is subjected to a large deformation during the simulation, the rubber model 5 can return to its previous shape.

In order to improve the simulation accuracy, the measured value of the Young's modulus of the rubber material 1 is set to the spring coefficient k of the expression (8), and the measured value of the viscosity (poise) of the rubber material 1 is set to the shear spring modulus η.

The shear spring modulus η is a parameter representing the friction between the rubber material 1 and the contact surface 2S. Therefore, if the contact state of the rubber material 1 with the contact surface 2s is to be analyzed but it is not necessary to analyze the friction as in this embodiment, the shear spring modulus n in the expression (8) can be omitted.

In this embodiment, the Arruda-Boyce constitutive equation according to the molecular chain network theory is defined on the rubber model 5.

Incidentally, the Arruda-Boyce constitutive equation according to
"A THREE-DIMENSIONAL CONSTITUTIVE MODEL FOR THE LARGE STRETCH BEHAVIOR OF RUBBER ELASTIC MATERIALS" Ellen M. Arruda and Marry c. Boyce, Journal of the Mechanics and Physics of Solids volume 41, Issue 2, Pages 389-412 (February 1993) may be transformed as appropriate, for example, as disclosed in Japanese Patent Application Publication No. 2011-242336, namely, as given by the following expression (9).

$$\sigma = k_B T \sqrt{N} L^{-1} \left( \frac{\lambda}{\sqrt{N}} \right) \qquad \text{expression (9)}$$

wherein
σ is the stress,
KB is Boltzmann constant,
T is the absolute temperature,
λ is the stretch,
N is the average number of segments per a molecular chain, and L(x) is Langevin function given by the following expression (10).

$$L(x) = \frac{d}{dx} \left\{ \ln \left( \frac{\sinh x}{x} \right) \right\} = \coth x - \frac{1}{x} \qquad \text{expression (10)}$$

By assigning the strain $\epsilon_{ij}$ of the rubber model 5 obtained from the expression (6) with the stretch λ of the expression (9), the stress σ which the rubber model 5 is subjected to from the contact surface 9s can be obtained. such stress σ is deemed to be the frictional force between the rubber model 5 and the contact zone model 9 of the contact zone 2 (shown in FIG. 1).

In this embodiment, a rigid member model 7 defined as being non-deformable is defined so as to abut on the surface of the rubber model 5 (the upper surface 5u in the figure) on the opposite side of the rubber model's surface contacting with the contact surface 9S of the contact zone model 9.

According to the particle method, the rigid member model 7 is modeled by a finite number of particles 8 each corresponding to numerical data stored in the computer 3.

On each particle 8, a physical quantity f(x) given by the expression (1) and a motion equation given by the expression (5) are defined.

On the rigid member model 7, an elastic constitutive equation for metal given by the following expression (11) is defined.

$$\{\sigma\} = [D]\{\epsilon\} \qquad \text{expression (11)}$$

wherein
{σ} is the stress matrix,
{ε} is the strain matrix, and
[D] is the stress-strain matrix.

Contact Zone Model Defining Process S2

In this process S2, a contact zone model 9 of the contact zone 2 including the contact surface 2s is defined in the computer 3. According to the particle method, the contact zone 2 is modeled by a finite number of particles 10 each corresponding to numerical data stored in the computer 3.

In this embodiment, the contact surface 9s of the contact zone model 9 is defined as having concavity and convexity such that upwardly projecting convex portions 15 and downwardly denting concave portions 16 are disposed alternately in the horizontal direction.

The roughness or height difference H1 between the upper end 15u of the convex portion 15 and the lower end 16d of the concave portion 16 may be arbitrarily defined.

On each particle 10 of the contact zone model 9, a physical quantity f(x) given by the expression (1) and a motion equation given by the expression (5) are defined.

In this embodiment, the contact zone model 9 is defined as a steel (for example, by setting a Young's modulus of 208 GPa and a Poisson's ratio of 0.33).

Therefore, the contact zone model 9 can be treated as a complete rigid body relative to the rubber model 5 whose Young's modulus is, for example, about 10 MPa.

In order to define the contact zone model 9 as a complete rigid body (steel), the above-mentioned expression (11) can be used. However, as another embodiment, it is also possible to define the contact zone model 9 as an elastic body.

Deformation Calculation Process S3

In this process S3, the rubber model 5 is contacted with the contact zone model 9, and the deformation of the rubber model 5 is calculated by the computer 3.

In this embodiment, a state in which the rubber model 5 is contacted with the contact surface 9s of the contact zone model 9, and slid on the contact surface 9s as shown in FIG. 1, is computed.

Figure 6:
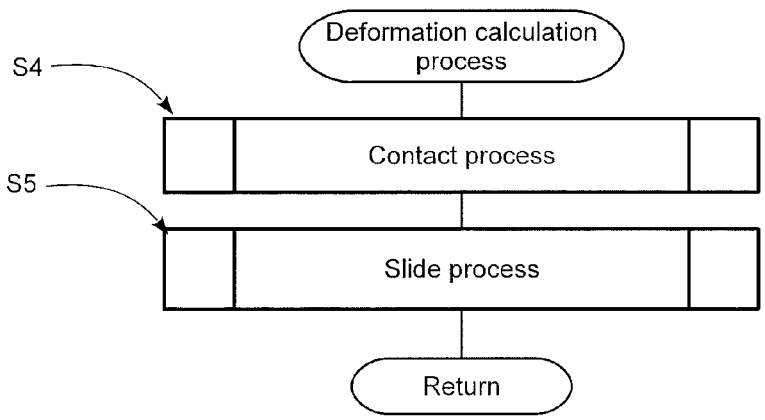
FIG. 6 is a flow chart of a deformation calculation process in the contact simulation method.

FIG. 6 shows a flowchart of such deformation calculation process S3 in this embodiment which includes a contact process S4 and a slide process S5.

Contact Process S4

In this process S4, the rubber model 5 is contacted with the contact zone model 9.

Figure 7:
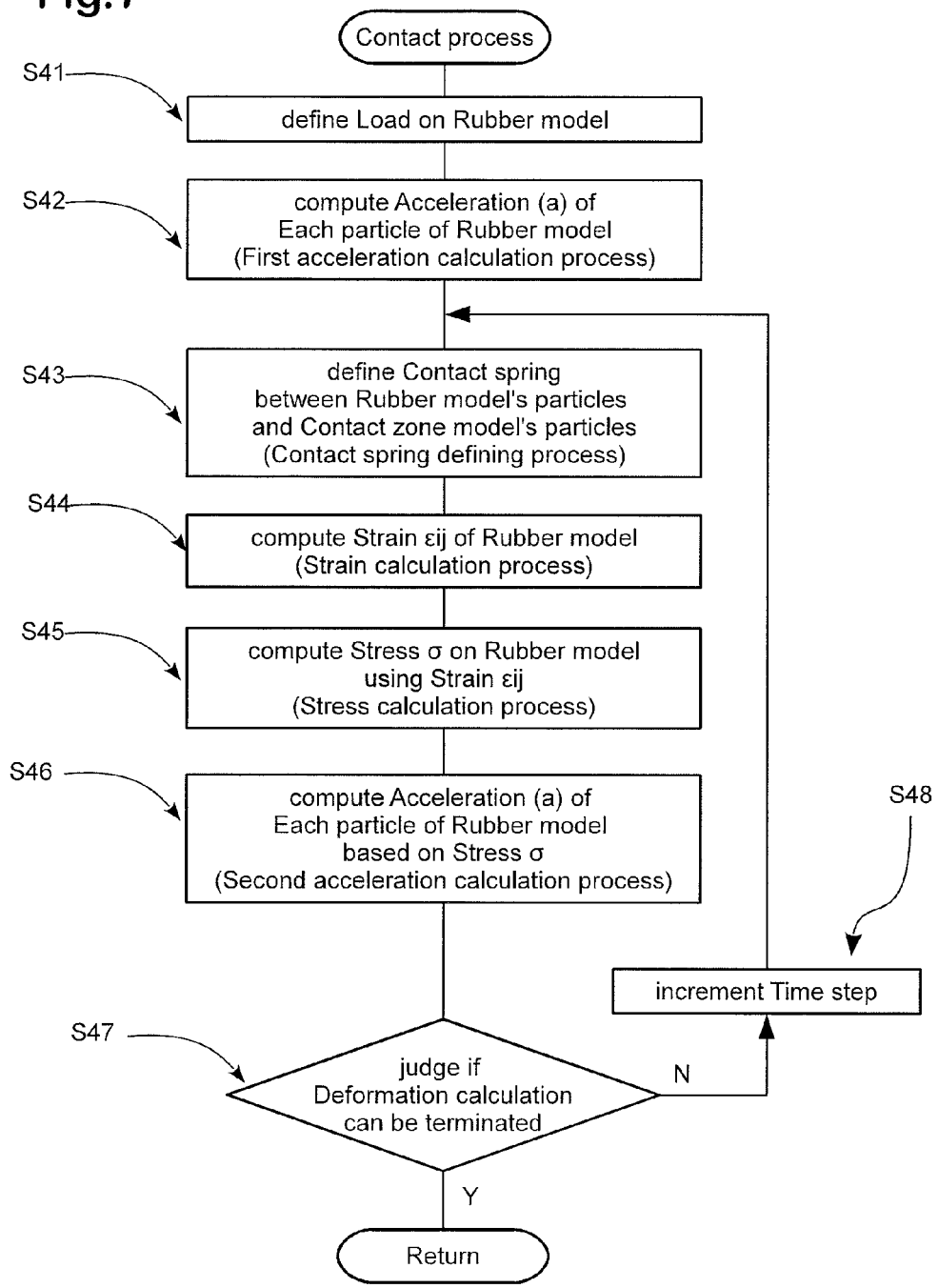
FIG. 7 is a flow chart of a contact process in the contact simulation method.

FIG. 7 shows a flowchart of such contact process S4 in this embodiment.

Load Applying Process S41

Figure 8A:
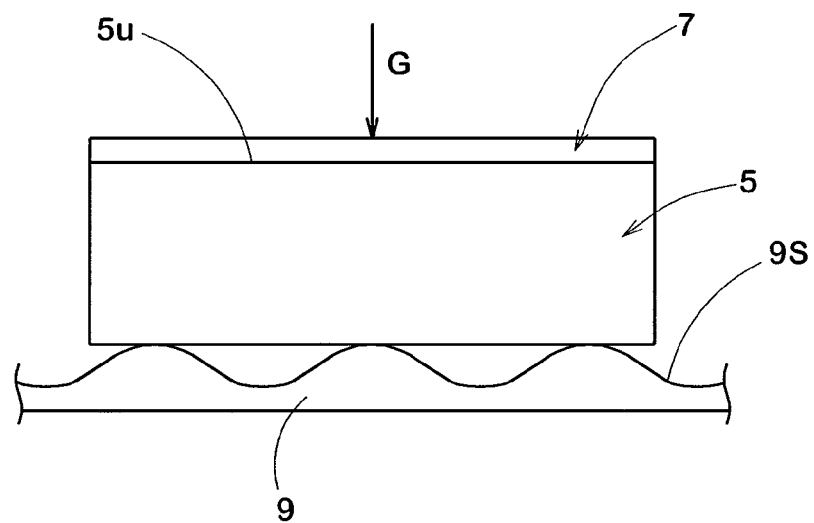
FIG. 8(a) shows a state in which the rubber model comes into contact with the surface of the contact zone model.

First, the rubber model 5 is contacted with the contact surface 9s as shown in FIG. 8(a).

Figure 8B:
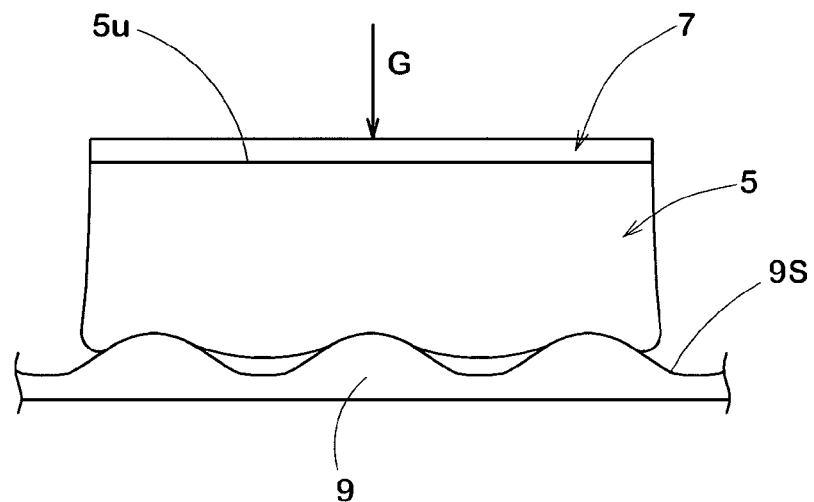
FIG. 8(b) shows a state in which the rubber model is deformed by the application of a load.

Then, a load G toward the contact zone model 9 is defined on (applied to) the rigid member model 7 on the rubber model 5 as shown in FIG. 8(b).

In the process S41 in this embodiment, according to a finite element method, the load G is assigned with the motion equations of the particles 8 of the rigid member model 7, and the motion of the rigid member model 7 is computed.

Since the rigid member model 7 is defined as being non-deformable, the load G continuously act on the entire upper surface 5u of the rubber model 5. Thus, the load G is so defined on the upper surface 5u.

First Acceleration Calculation Process S42

In this process 42, according to the motion equation given by the expression (7), the acceleration (a) of each particle 6 of the rubber model 5 caused by the application of the load G is computed.

In the process S42 in this embodiment, based on the computed motion of the rigid member model 7, the acceleration (a) of each particle 6 of the rubber model 5 is computed. Then, based on the acceleration (a), the motion of each particle 6 is computed, namely, the deformation of the rubber model 5 by the application of the load G is computed.

Contact Spring Defining Process S43

In this process S43, as shown in FIG. 9, between the particles 6 of the rubber model 5 and the particles 10 of the contact zone model 9, a contact spring 20 is defined.

The contact spring 20 is to exert resilience resisting a contact between the particle 6 and the particle 10 between which the contact spring 20 is defined.

In this embodiment, the contact spring 20 is defined by the above-mentioned viscoelastic force f given by the expression (8). The motion of the particle 6 on which the contact spring 20 is defined, can be defined by the motion equation given by the above-mentioned expression (7) in which the viscoelastic force f is incorporated.

Such contact spring 20 is defined on only each particle 6 of the rubber model 5 whose distance L3 from any particle 10 of the contact zone model 9 is not more than the influence radius h. In other words, the contact spring 20 is defined only in the surface portion of the rubber model which portion comes into contact with the contact zone model at that point in time. Therefore, in such surface portion, the contact spring 20 can prevent the particle 6 of the rubber model 5 from penetrating into the contact zone model 9, and the contact between the rubber model 5 and the contact zone model 9 can be maintained to enable accurate contact simulation.

Strain Calculation Process S44

In this process S44, the strain $\epsilon_{ij}$ of the rubber model 5 occurring after its motion caused by the acceleration (a) is computed according to the expression (6).

In this embodiment, since the contact spring 20 is defined, the strain $\epsilon_{ij}$ of the rubber model 5 can be obtained with high accuracy.

Stress Calculation Process S45

In this process S45, according to the obtained strain $\epsilon_{ij}$ of the rubber model 5, the stress σ which the rubber model 5 receives from the contact zone model 9 is computed.

In this embodiment, by assigning the strain $\epsilon_{ij}$ with the Arruda-Boyce constitutive equation given by the expression (9), the stress σ is computed.

Such stress σ corresponds to the frictional force between the rubber model 5 and the contact zone model 9.

Second Acceleration Calculation Process S46

Based on the obtained stress σ, a renewed acceleration (a) of each particle 6 of the rubber model 5 is computed.

More specifically, by assigning the stress σ with the motion equation give by the expression (7) defined on each particle 6 of the rubber model 5, the acceleration (a) of each particle 6 is obtained.

Thereby, the renewed acceleration (a) based on the stress σ which the rubber model 5 has received from the contact zone model 9 is defined on each particle 6.

According to the renewed acceleration (a), the motion of each particle 6, namely, the deformation of the rubber model 5 is computed.

Termination Judging Process S47

In this process S47, the computer 3 judges if the calculation of the deformation of the rubber model 5 can be terminated.

More specifically, when the motion of the particles 6 of the rubber model 5 has been converged, the calculation is considered as being possible to terminate.

If "No", the time step is incremented by a unit time Tx. (Process S48)

Then, the contact spring defining process S43, strain calculation process S44, stress calculation process S45, second acceleration calculation process S46, and termination judging process S47 are repeated.

If "Yes", the contact process S4 is ended.

Thus, the calculation of the deformation of the rubber model 5 caused by the application of the load G is terminated. Then, the process goes to the next slide process S5.

Slide Process S5

Figure 10:
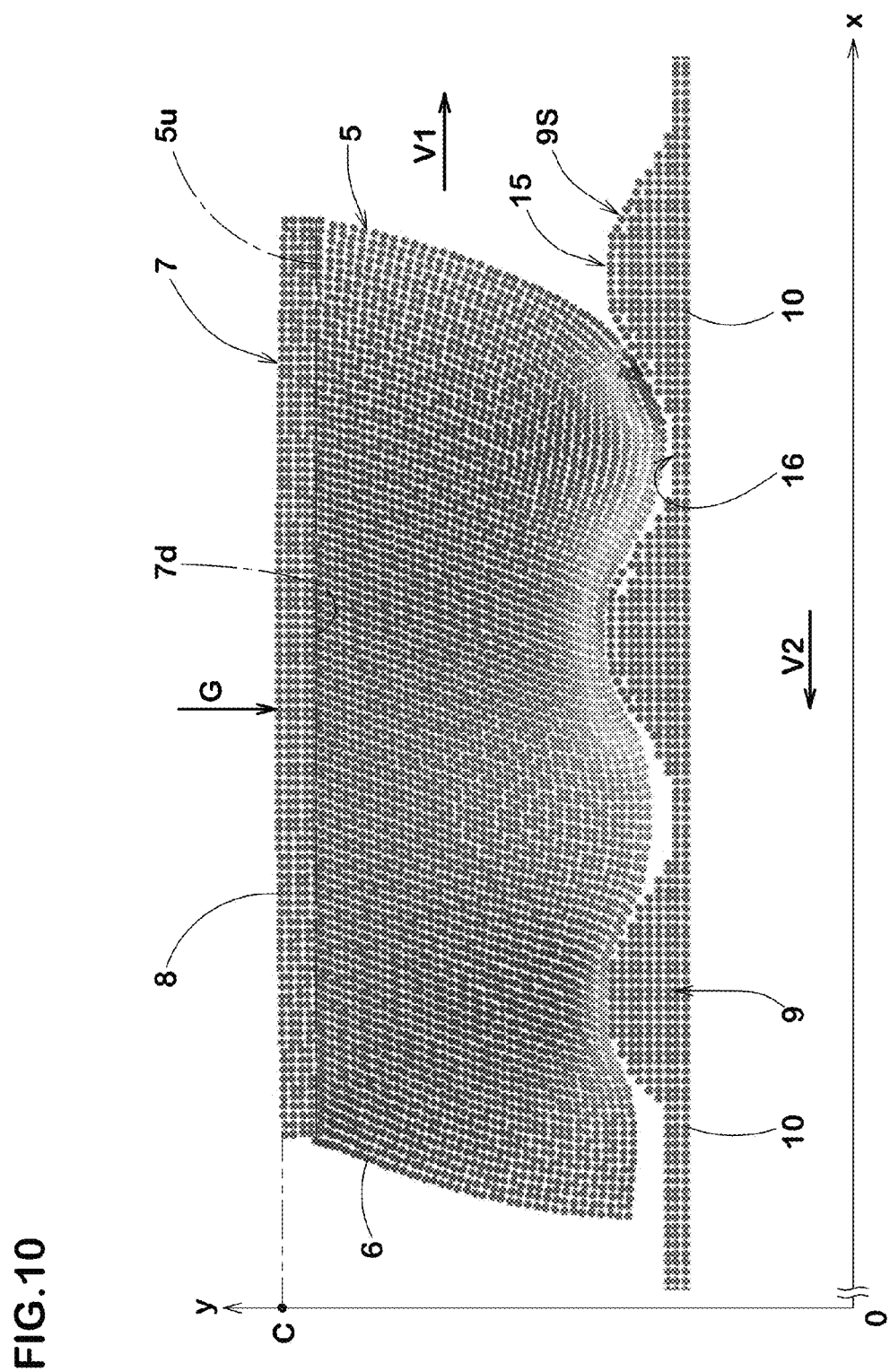
FIG. 10 shows the rubber model and the contact zone model for explaining the deformation calculation process in this embodiment.

In this process S5, a state in which the rubber model 5 is slid on the contact surface 9S of the contact zone model 9 as the load G is defined on (being applied to) the rubber model 5 as shown in FIG. 10, is computed by the computer.

Figure 11:
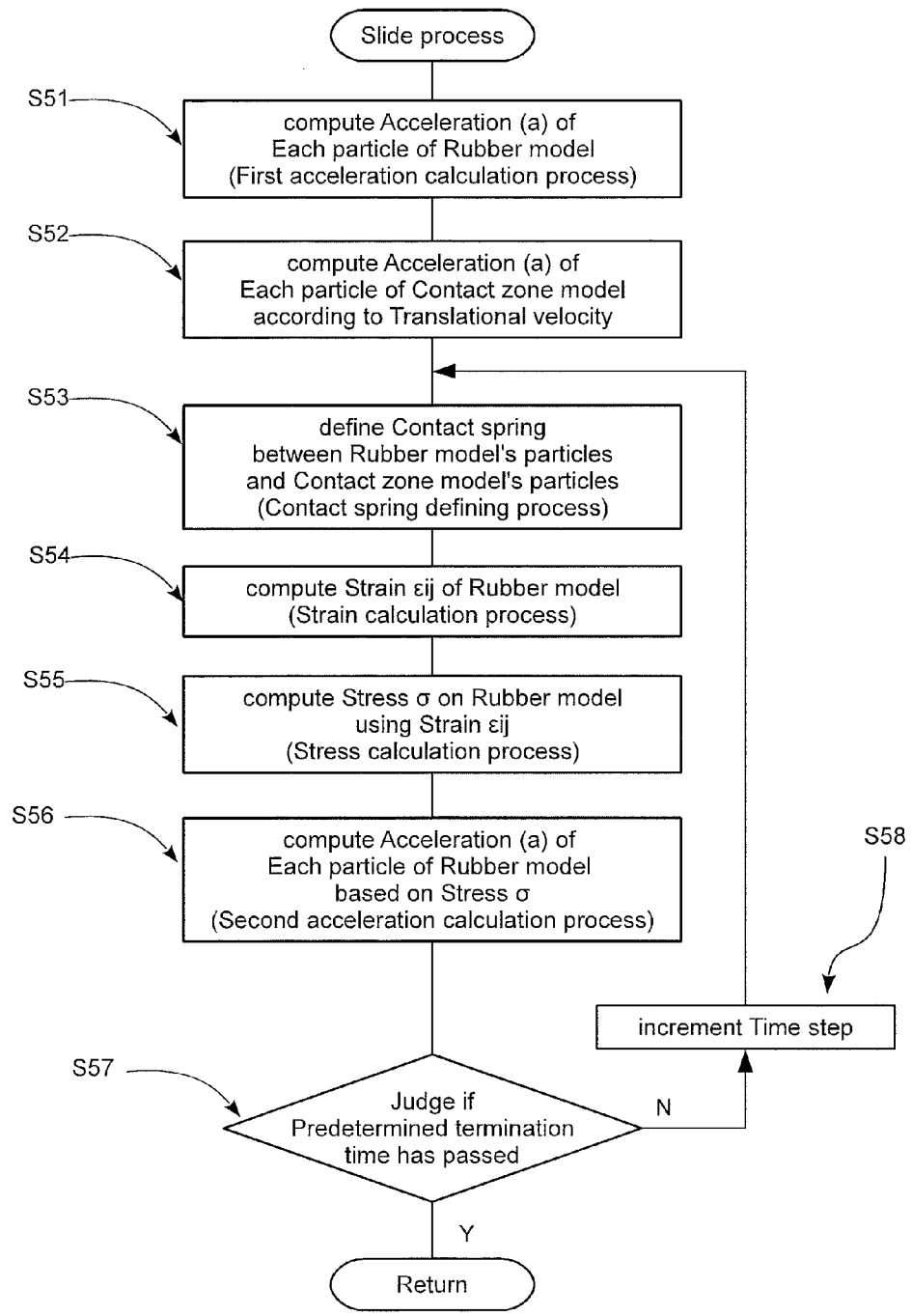
FIG. 11 is a flow chart of a slide process in the contact simulation method.

FIG. 11 shows a flowchart of such slide process S5 in this embodiment.

First acceleration calculation process S51

In the process S51 in this embodiment, as shown in FIG. 10, the acceleration (a) of each particle 6 of the rubber model 5 due to the slide velocity V1 of the rubber model 5 is computed according to the motion equation given by the expression (7). Based on the computed acceleration (a), the motion of each particle 6 is computed, namely, the slide of the rubber model 5 is computed.

Process S52

In this process S52, the acceleration (a) of each particle 10 of the contact zone model 9 due to the translational velocity V2 corresponding to the slide velocity V1 is computed according to the motion equation given by the expression (5). Based on the computed acceleration (a), the motion of each particle 10 is computed, namely, the motion of the contact zone model 9 is computed.

By these processes S51 and S52, therefore, the state in which the rubber model 5 is slid on the contact surface 9s of the contact zone model 9 can be computed.

Contact Spring Defining Process S53

In this process S53, as shown in FIG. 9, between the particles 6 of the rubber model 5 and the particles 10 of the contact zone model 9, a contact spring 20 is defined.

Similarly to the contact spring defining process S43, the contact spring 20 is defined on only each particle 6 of the rubber model 5 whose distance L3 from any particle 10 of the contact zone model 9 is not more than the influence radius h.

Therefore, the contact between the rubber model 5 and the contact zone model 9 can be maintained during the rubber model 5 slides on the contact surface 9s of the contact zone model 9.

Strain Calculation Process S54

In this process S54, as shown in FIG. 10, the strain $\epsilon_{ij}$ of the rubber model 5 occurring after its motion caused by the acceleration (a) is computed according to the expression (6).

Stress Calculation Process S55

In this process S55, according to the obtained strain $\epsilon_{ij}$ of the rubber model 5, the stress σ which the rubber model 5 receives from the contact zone model 9 is computed.

More specifically, by assigning the strain $\epsilon_{ij}$ with the Arruda-Boyce constitutive equation given by the expression (9), the stress σ is computed.

Such stress σ corresponds to the frictional force between the contact surface 9S of the contact zone model 9 and the rubber model 5 sliding thereon.

Second Acceleration Calculation Process S56

Next, based on the obtained stress σ, a renewed acceleration (a) of each particle 6 of the rubber model 5 is computed.

More specifically, by assigning the stress σ with the motion equation given by the expression (7) defined on each particle 6 of the rubber model 5, the acceleration (a) of each particle 6 is computed.

Thereby, the renewed acceleration (a) based on the stress σ which the rubber model 5 has received from the contact zone model 9 is defined on each particle 6.

Then, according to the renewed acceleration (a), the motion of each particle 6, namely, the slide of the rubber model 5 is computed.

Termination Judging Process S57

In the process S57, the computer 3 judges if the predetermined termination time has passed.

If "No", the time step is incremented by a unit time Tx. (Process S58),

Then, the above-mentioned contact spring defining process S53, strain calculation process S54, stress calculation process S55, second acceleration calculation process S56, and termination judging process S57 are repeated.

If "Yes", the slide process S5 is ended.

As a result, time-series data about the strain $\epsilon_{ij}$ and stress σ of the rubber model 5 obtained every unit time Tx from the beginning to the end of the slide are produced through the above-mentioned processes, and stored in the computer 3.

Incidentally, the termination time can be determined arbitrarily according to the simulation to be made.

As described above, in the contact simulation method in this embodiment, since the rubber material 1 is modeled by a finite number of the particles 6, the deformation calculation process S3 can treat a large deformation for example, a tensile deformation more than 100%, without calculation failure. Further, since the particle 6 of the rubber model 5 is not link to the adjacent particles 6, it is possible to perform the deformation calculation while the rubber model 5 adheres to the contact surface 9S even if the contact surface 9S is provided with roughness as in this embodiment.

Further, the motion equation given by the expression (7) has a term corresponding to the resilience of the rubber material 1 against tensile deformation. Therefore, even if the rubber model 5 is subjected to a large deformation, the rubber model 5 can restore its previous shape.

In the contact simulation method in this embodiment, therefore, the calculation failure caused by breaking of the elements can be prevented, and the contact state of the rubber material 1 with the contact surface 2s as shown in FIG. 1 can be simulated with high accuracy.

In this embodiment, furthermore, as shown in FIG. 9, the contact spring 20 is defined, therefore, the particles 6 of the rubber model 5 are prevented from penetrating between the particles 10 of the contact zone model 9. As a result, at the interface, the particles 6 of the rubber model 5 can readily contact with or separate from the particles 10 of the contact zone model 9. Therefore, the contact state of the rubber material 1 with the contact surface 2S can be simulated with high accuracy.

The diameters D2 of the particles 6 of the rubber model 5 and the particles 10 of the contact zone model 9 can be determined arbitrarily. But, it is desirable that the particles 6 and particles 10 have the same diameter D2 as shown in FIG. 9. In view of the analytical accuracy, it is desirable to decrease the diameters D2 of the particles 6 and the diameters D2 of the particles 10.

The above-mentioned roughness or height difference H1 can be determined arbitrarily. But, in order to accurately simulate the contact of the rubber material, it is preferred that at least five layers of the particles 10 are defined between the upper end 15u of the convex portion 15 and the lower end 16d of the concave portion 16. In other words, the height difference H1 is at least five times the distance D1 between the adjacent particles 10 and 10.

The above-described slide process S5 in this embodiment can be performed as the coordinate C of the lower surface 7d of the rigid member model 7 in the vertical direction (y-axial direction) is kept at a fixed value as shown in FIG. 10. Therefore, vertical movements of the upper surface 5u of the rubber model 5 caused by for example the convex portions 15 and concave portions 16, is inhibited by the rigid member model 7. As a result, it is possible to increase the amount of deformation of the rubber model 5.

Incidentally, the coordinate C of the rigid member model 7 can be determined arbitrarily according to the simulation to be made.

Further, the rigid member model 7 can be defined as being a complete rigid body (for example, steel) similarly to the contact zone model 9. As a result, the rigid member model 7 can inhibit vertical movements of the rubber model 5 to improve the simulation accuracy.

Evaluating Process S6

In the evaluating process S6 next to the process S3, it is judged whether the state of contact between the rubber model 5 with the contact surface 9S of the contact zone model 9 is good or not.

In this embodiment, the contact state is evaluated based on the strain $\epsilon_{ij}$ of the rubber model 5 and the stress σ (frictional force) received from the contact zone model 9 which have been stored every unit time Tx in the deformation calculation process S3 (the slide process S5).

Manufacturing Process S7

If the contact state of the rubber model 5 is judged as being good, according to the material characteristics defined on the rubber model 5, the rubber material 1 is manufactured.

Design Change Process S8

If the contact state of the rubber model 5 is judged as being not good, the material characteristics of the rubber model are changed.

Then, the simulation (S3 to S6) is again performed.

In this embodiment, since the rubber model 5 is changed until the contact state of the rubber model 5 is judged as being good, it is possible to develop the rubber material 1 which can present good contact states.

Comparison Test

According to the procedure shown in FIG. 3, the rubber model and contact zone model shown in FIG. 4 were created or defined, and the rubber model was contacted with the contact zone model as shown in FIG. 10. Then, by setting the following different values (Embodiments 1 to 3) to the slide velocity V1 of the rubber model, the above-mentioned deformation calculation was performed.

For comparison, according to the finite element method, a rubber model and a contact zone model of the rubber material and the contact zone shown in FIG. 1 each modeled by a finite number of elements were defined, and the deformation calculation (Comparative example) was performed.

The parameters and conditions are as follows.
Slide velocity V1
　Embodiment 1: 3 meter/second
　Embodiment 2: 10 meter/second
　Embodiment 3: 30 meter/second
　Comparative example: 3 meter/second
Load G: 0.14 MPa
Distance D1 between adjacent particles: 1 mm
Density ρ of particle: 0.95 g/cu·cm
Roughness or height difference H1: 5 mm
Influence radius: D1×2
Spring coefficient k: 100 N/mm
Shear spring modulus η: 0 poise
Spring length $\Delta L_i$: corresponding to one particle
Amount $\Delta C_i$ of stretching: defined during simulation
Time increment $\Delta t$: $1\times10^{-4}$ second
weighting factor $W_i$: the cubic spline function according to the non-patent document 3
Boltzmann constant KB: $1.38066\times10^{-29}$
Absolute temperature T: 296 K
Average number N of segments per a molecular chain: 8
Stress-strain matrix [D]: determined by the material constant was defined (cf. non-patent document 3)

Incidentally, the stress matrix{σ}, strain matrix{ε}, the coordinate $x_i$ and the velocity $V_i$ of the evaluating particle, and the coordinate $x_j$ and the velocity $V_j$ of another particle existing within the range of the influence radius were computed and defined during simulation.

The deformation calculations of Embodiments 1 to 3 were ended successfully without calculation failure whereas the deformation calculation of comparative example was abnormally ended as a result of the occurrence of a calculation failure due to breaking of the elements.

Figure 12:
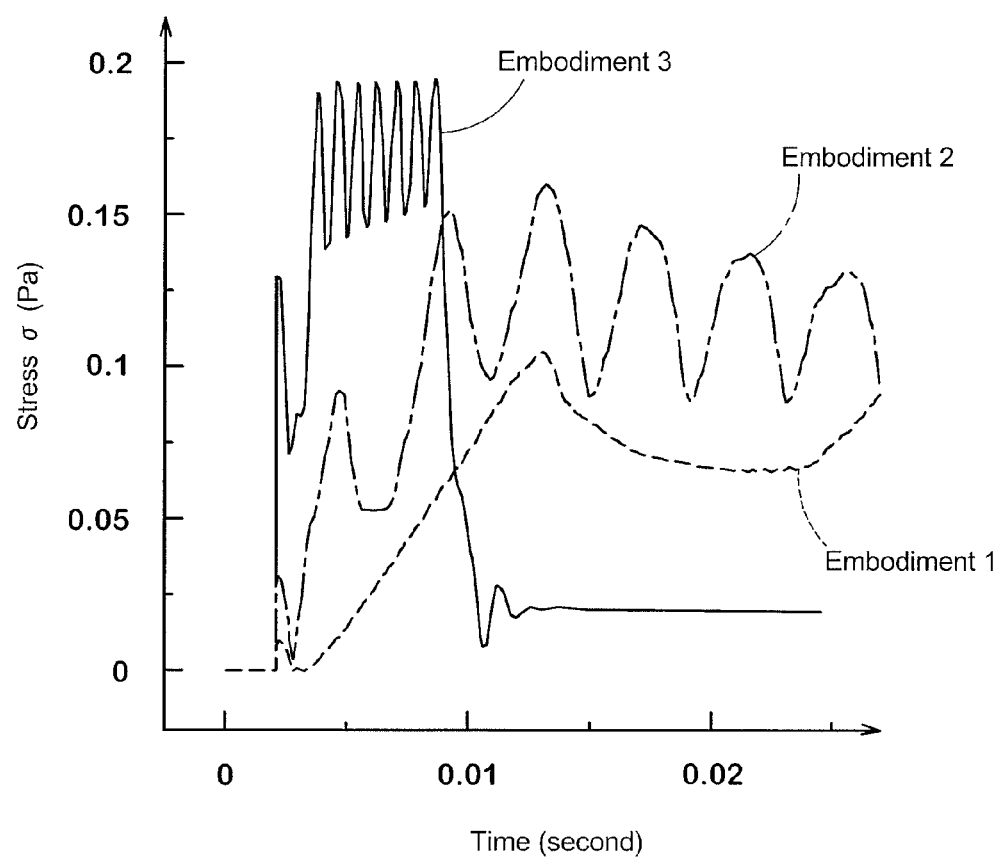
FIG. 12 shows stress-time graphs obtained as simulation results.

In FIG. 12, the computed stress (frictional force) is shown as a function of time.

As shown, it was confirmed that, in the initial stage of the slide from the beginning to 0.001 seconds, the higher the slide velocity V1, the higher the stress σ (frictional force).

In the middle stage of the slide after 0.001 seconds, the stress σ (frictional force) of Embodiment 3 where the slide velocity V1 was highest became significantly reduced.

Form such simulation results, it was confirmed that the stress σ (frictional force) of the rubber model well coincides with the frictional force of the real rubber material.

Figure 13A:
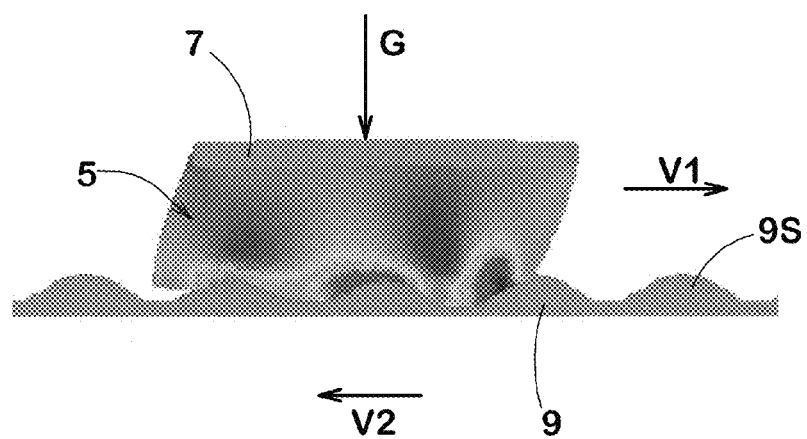
FIG. 13(a) shows the rubber model as a simulation result of Embodiment 1.
Figure 13B:
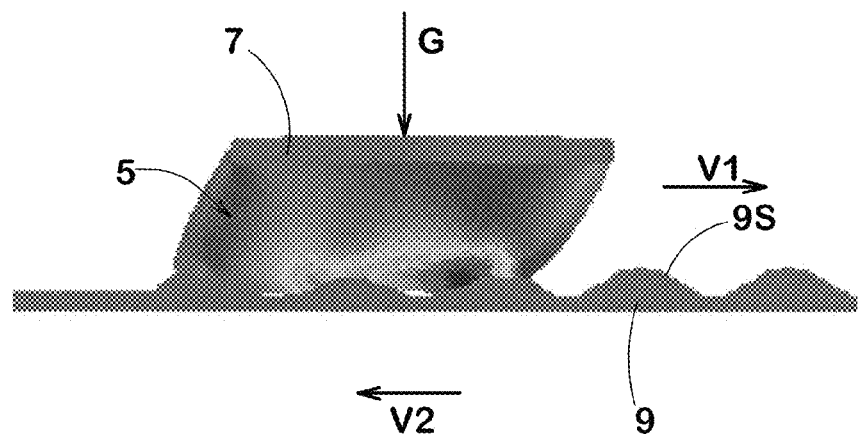
FIG. 13(b) shows the rubber model as a simulation result of Embodiment 3.

FIG. 13(*a*) shows the rubber model of Embodiment 1 rendered from the data at a time point in the initial stage of slide. FIG. 13(*b*) shows the rubber model of Embodiment 3 rendered from the data at a time point in the initial stage of slide.

As shown, it was confirmed that the rubber model of Embodiment 3 where the slide velocity V1 was highest was warped largely when compared with the rubber model of Embodiment 1 where the slide velocity V1 was lowest. This shows that the rubber model of Embodiment 3 is subjected to a frictional force larger than that in the rubber model of Embodiment 1. Therefore, it was confirmed that the contact simulation method according to the present invention can simulate the contact state with high accuracy.

The invention claimed is:

1. A computer-implemented method for simulating a contact state of a rubber material with a contact surface during sliding on the contact surface, comprising:
　a rubber model defining process in which a rubber model of the rubber material is defined in the computer, wherein the rubber material is modeled by a finite number of particles so that the rubber model is made up of the particles;
　a contact zone model defining process in which a contact zone model of a contact zone including the contact surface is defined in the computer, wherein the contact zone is modeled by a finite number of particles so that the contact zone model is made up of the particles; and
　a deformation calculation process in which the rubber model is contacted with the contact zone model, and a deformation calculation of the rubber model is performed by the computer, wherein
　in the contact zone model defining process, the contact surface of the contact zone is defined as having concavity and convexity,
　in the deformation calculation process, a load on the rubber material toward the contact zone is defined on the rubber model, and a state of the rubber model sliding on the contact surface is computed,
　wherein, on each of the particles of the rubber model, a motion equation given by following expressions (1) and (2) is defined, $$a + f = \frac{1}{\rho}\nabla\cdot\sigma, \quad \text{expression (1)}$$

$$f = \frac{1}{\rho}\sum_{i}^{n}\left(k\frac{\Delta C_i}{\Delta L_i}W_i + \eta\frac{\Delta C_i}{\Delta t}W_i\right), \quad \text{expression (2)}$$

wherein
　f is a viscoelastic force between concerned particles,
　k is a spring coefficient,
　η is a shear spring modulus,
　$\Delta L_i$ is a length of a spring,
　$\Delta C_i$ is an amount of stretch,
　$\Delta t$ is a time increment, and
　$W_i$ is a weighting factor, wherein the motion equation is obtained by adding the viscoelastic force given by the expression (2) to a left-hand side of following expression (3) used in the SPH (Smoothed Particle Hydrodynamics) method $$a = \frac{1}{\rho} \nabla \cdot \sigma,$$ expression (3)

and wherein a is the acceleration of a particle concerned,

ρ is the density of the particle, and

σ is a stress tensor, wherein in the deformation calculation process, a frictional force between the rubber model and the contact zone model is obtained from a stress of the rubber model, and the method further comprises:

an evaluating process in which the contact state is evaluated based on the frictional force obtained in the deformation calculation process;

a design adjusting process in which when the contact state of the rubber model is evaluated as being not good, material characteristics of the rubber model are adjusted; and a manufacturing process in which when the contact state of the rubber model is evaluated as being good, the rubber material is manufactured, wherein in the evaluating process, if the frictional force is larger than a given criterion, then the contact state of the rubber model is evaluated as being good, and if the frictional force is less than the given criterion, then the contact state of the rubber model is evaluated as being not good.

2. The method according to claim 1, wherein in the deformation calculation process, between the particles of the contact zone model and the particles of the rubber model located in a surface portion of the rubber model contacting with the contact zone model, a contact spring expressive of contact between the rubber model and the contact zone model is defined by the viscoelastic force f given by the expression (2).

3. The method according to claim 1, wherein the rubber model is a two-dimensional model, a rigid member model defined as being non-deformable is defined so as to abut on a surface of the rubber model opposite to the surface of the rubber model contacting with the contact surface, and in the deformation calculation process, the rigid member model is kept unchanged with respect to coordinates of the rigid member model in a vertical direction perpendicular to the slide direction of the rubber model.

4. The method according to claim 1, wherein the Arruda-Boyce constitutive equation is defined on the rubber model, and the deformation calculation process includes a first acceleration calculation process, and a strain calculation process, a stress calculation process and a second acceleration calculation process which are repeated during the deformation calculation process, and wherein in the first acceleration calculation process, the acceleration of each particle of the rubber model is computed according to the motion equation, in the strain calculation process, strain on the rubber model in which motion is caused by the acceleration is computed, in the stress calculation process, said stress which the rubber model receives from the contact zone model is computed by assigning the strain on the rubber model with the Arruda-Boyce constitutive equation, and in the second acceleration calculation process, by assigning the stress with the motion equation, the acceleration of each particle of the rubber model is computed.

* * * * *